(12) United States Patent
Ikeda et al.

(10) Patent No.: US 12,512,449 B2
(45) Date of Patent: *Dec. 30, 2025

(54) DISPLAY DEVICE AND ARRAY SUBSTRATE

(71) Applicant: Japan Display Inc., Tokyo (JP)

(72) Inventors: Masanobu Ikeda, Tokyo (JP); Yasuhiro Kanaya, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/635,729

(22) Filed: Apr. 15, 2024

(65) Prior Publication Data

US 2024/0258295 A1    Aug. 1, 2024

Related U.S. Application Data

(63) Continuation of application No. 17/104,867, filed on Nov. 25, 2020, now Pat. No. 11,990,457, which is a
(Continued)

(30) Foreign Application Priority Data

May 31, 2018    (JP) ................. 2018-105501

(51) Int. Cl.
*H01L 27/14* (2006.01)
*H01L 25/16* (2023.01)
(Continued)

(52) U.S. Cl.
CPC ......... *H01L 25/167* (2013.01); *H10H 20/857* (2025.01); *G09G 3/32* (2013.01)

(58) Field of Classification Search
CPC ........... H01L 25/167; H01L 33/00–648; H01L 27/15–156; H01L 2933/00–0091; H01L 33/36–42; H01L 33/62; H01L 2933/0016; H01L 2933/0066; H01L 33/647; G09G 3/32; H10H 20/00–882;
(Continued)

(56) References Cited

U.S. PATENT DOCUMENTS 5,382,484 A    1/1995   Hosono
2008/0297055 A1   12/2008  Miyake et al.
(Continued)

FOREIGN PATENT DOCUMENTS

JP    2008299019 A    12/2008
JP    2011113989 A    6/2011
(Continued)

OTHER PUBLICATIONS

International Search Report issued in Application No. PCT/JP2019/016301, dated Jun. 18, 2019.

*Primary Examiner* — Ismail A Muse
(74) *Attorney, Agent, or Firm* — K&L Gates LLP

(57) ABSTRACT

A display device includes a substrate, a plurality of pixels arrayed on the substrate, an inorganic light-emitting element
(Continued)

provided to each of the pixels, an anode electrode electrically coupled to the inorganic light-emitting element, a transistor provided on a first surface of the substrate, and coupling wiring that couples the anode electrode and the transistor. The anode electrode protrudes from an inside to an outside of the inorganic light-emitting element in planar view from a normal direction of the substrate.

18 Claims, 13 Drawing Sheets

Related U.S. Application Data continuation of application No. PCT/JP2019/016301, filed on Apr. 16, 2019.

(51) Int. Cl.
*H01L 29/04* (2006.01)
*H01L 29/15* (2006.01)
*H01L 31/036* (2006.01)
*H10H 20/857* (2025.01)
*G09G 3/32* (2016.01)

(58) Field of Classification Search
CPC ... H10H 29/00–142; H10H 29/30–962; H10H 20/858–8586; H10H 29/858–8586
See application file for complete search history.

(56) References Cited

U.S. PATENT DOCUMENTS

| | | |
|---|---|---|
| 2014/0267683 A1 | 9/2014 | Bibl et al. |
| 2015/0198853 A1 | 7/2015 | Park et al. |
| 2017/0064291 A1 | 3/2017 | Do et al. |
| 2017/0133620 A1 | 5/2017 | Lee et al. |
| 2017/0148773 A1 | 5/2017 | Sakariya et al. |
| 2017/0213502 A1 | 7/2017 | Henry et al. |
| 2018/0122298 A1* | 5/2018 | Lee ................. H01L 25/167 |
| 2018/0123080 A1 | 5/2018 | Kim et al. |
| 2020/0203655 A1 | 6/2020 | Wan et al. |
| 2022/0005790 A1 | 1/2022 | Watanabe et al. |

FOREIGN PATENT DOCUMENTS

| | | |
|---|---|---|
| JP | 2016512347 A | 4/2016 |
| JP | 2017529557 A | 10/2017 |

* cited by examiner

DISPLAY DEVICE AND ARRAY SUBSTRATE

CROSS-REFERENCE TO RELATED APPLICATION

This application is a continuation of U.S. patent application Ser. No. 17/104,867, filed on Nov. 25, 2020, which application is a continuation of PCT International Application Ser. No. PCT/JP2019/016301 filed on Apr. 16, 2019 which designates the United States, incorporated herein by reference, and which claims the benefit of priority from Japanese Patent Application No. 2018-105501 filed on May 31, 2018, incorporated herein by reference.

BACKGROUND

1. Technical Field

The present disclosure relates to a display device and an array substrate.

2. Description of the Related Art

Inorganic electroluminescent (EL) displays provided with inorganic light-emitting diodes (micro LEDs) serving as display elements have recently been attracting attention (refer to Japanese Translation of PCT International Application Publication No. 2017-529557). In inorganic EL displays, a plurality of light-emitting elements that output light in different colors are arrayed on an array substrate. Inorganic EL displays do not require any light source because they are provided with self-emitting elements and have higher light use efficiency because light is output without passing through a color filter. Inorganic EL displays have higher environmental resistance than organic EL displays provided with organic light-emitting diodes (OLEDs) serving as display elements.

The luminous efficiency of inorganic LEDs decreases with a rise in temperature. In display devices provided with inorganic LEDs, luminance may possibly decrease with a rise in temperature, thereby deteriorating display characteristics.

SUMMARY

A display device according to one embodiment includes a substrate, a plurality of sub-pixels arrayed on the substrate, an inorganic light-emitting element provided to each of the sub-pixels, an anode electrode electrically coupled to the inorganic light-emitting element, a transistor provided on a first surface of the substrate, and coupling wiring that couples the anode electrode and the transistor. The anode electrode protrudes from an inside to an outside of the inorganic light-emitting element in planar view from a normal direction of the substrate.

DETAILED DESCRIPTION

Figure 1:
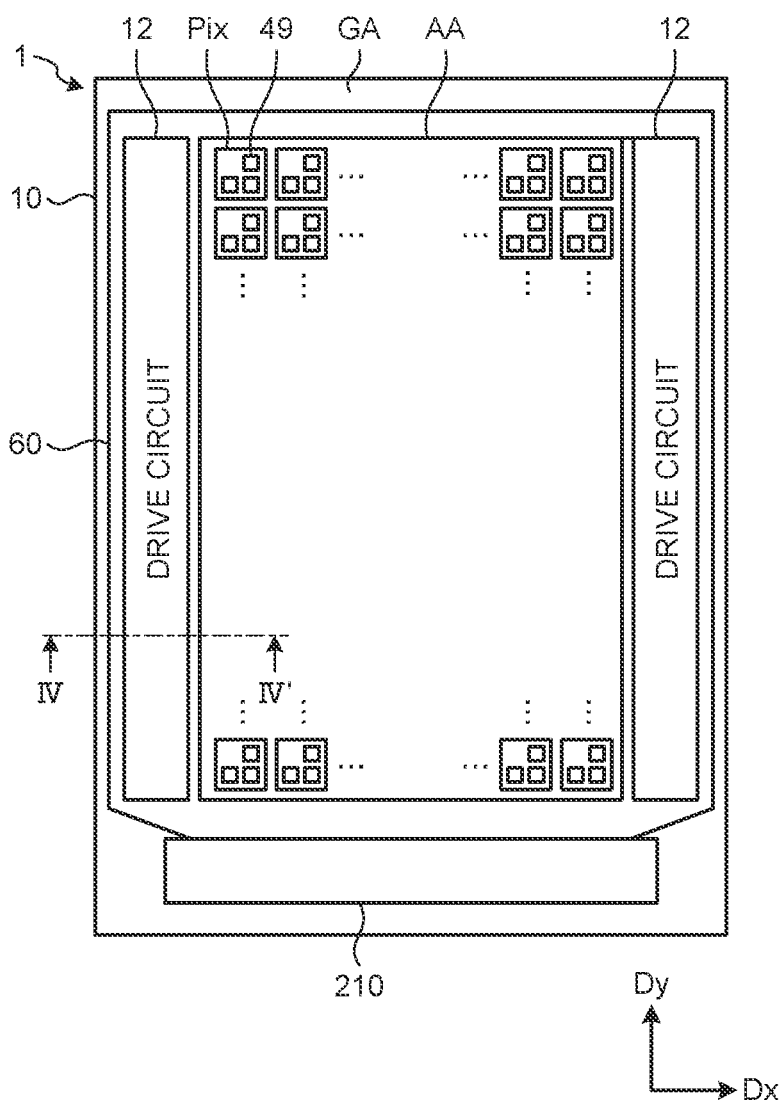
FIG. 1 is a plan view of an exemplary configuration of a display device according to an embodiment.

Exemplary embodiments according to the present disclosure are described below with reference to the accompanying drawings. What is disclosed herein is given by way of example only, and appropriate changes made without departing from the spirit of the present disclosure and easily conceivable by those skilled in the art naturally fall within the scope of the disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the figures, components similar to those previously described with reference to previous figures are denoted by like reference numerals, and detailed explanation thereof may be appropriately omitted.

FIG. 1 is a plan view of an exemplary configuration of a display device according to an embodiment. As illustrated in FIG. 1, a display device 1 includes an array substrate 2, a plurality of pixels Pix, drive circuits 12, a drive integrated circuit (IC) 210, and cathode wiring 60.

The array substrate 2 is a drive circuit substrate for driving the pixels Pix and is also called a backplane or an active matrix substrate.

As illustrated in FIG. 1, the display device 1 has a display region AA and a peripheral region GA. The display region AA is provided with the pixels Pix and displays an image. The peripheral region GA does not overlap the pixels Pix and is disposed outside the display region AA.

The pixels Pix are arrayed in a first direction Dx and a second direction Dy in the display region AA. The first direction Dx and the second direction Dy are parallel to a first surface 10a (refer to FIG. 4) of a substrate 10 of the array substrate 2. The first direction Dx is orthogonal to the second direction Dy. The first direction Dx may intersect the second direction Dy without being orthogonal thereto. A third direction Dz is orthogonal to the first direction Dx and the second direction Dy. The third direction Dz corresponds to the normal direction of the substrate 10, for example. In the following description, planar view indicates the positional relation when viewed from the third direction Dz.

The drive circuits 12 drive a plurality of gate lines (first gate lines GCL1 and second gate lines GCL2 (refer to FIG. 3)) based on various control signals received from the drive IC 210. The drive circuits 12 sequentially or simultaneously select a plurality of gate lines and supply gate drive signals to the selected gate lines. As a result, the drive circuits 12 select a plurality of pixels Pix coupled to the gate lines.

The drive IC 210 is a circuit that controls display on the display device 1. The drive IC 210 may be mounted on the peripheral region GA of the substrate 10 by chip-on-glass (COG) bonding. The mounting form of the drive IC 210 is not limited thereto, and the drive IC 210 may be mounted on FPCs or a rigid substrate coupled to the peripheral region GA of the substrate 10 by chip-on-film (COF) bonding.

The cathode wiring 60 is provided in the peripheral region GA of the substrate 10. The cathode wiring 60 is provided surrounding the pixels Pix in the display region AA and the drive circuits 12 in the peripheral region GA. Cathode terminals 90p (refer to FIG. 4) of a plurality of inorganic light-emitting elements 100 (refer to FIG. 4) are coupled to the common cathode wiring 60 and supplied with a reference potential (e.g., a ground potential). More specifically, the cathode terminal 90p (second terminal) of the inorganic light-emitting element 100 is coupled to the cathode wiring 60 via a cathode electrode 90e (second electrode) provided to a TFT substrate.

Figure 2:
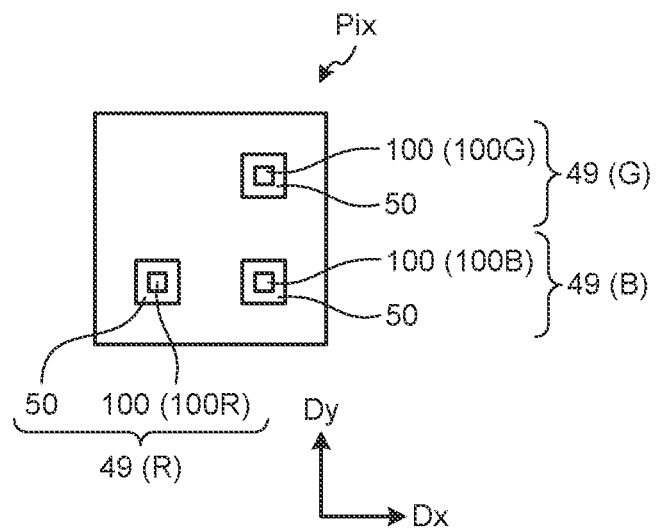
FIG. 2 is a plan view of an exemplary configuration of a sub-pixel.

FIG. 2 is a plan view of an exemplary configuration of the pixel. As illustrated in FIG. 2, one pixel Pix includes a plurality of sub-pixels 49. The pixel Pix includes a first sub-pixel 49R, a second sub-pixel 49G, and a third sub-pixel 49B, for example. The first sub-pixel 49R displays a primary color of red as the first color. The second sub-pixel 49G displays a primary color of green as the second color. The third sub-pixel 49B displays a primary color of blue as the third color. As illustrated in FIG. 2, the first sub-pixel 49R and the third sub-pixel 49B are disposed side by side in the first direction Dx in one pixel Pix. The second sub-pixel 49G and the third sub-pixel 49B are disposed side by side in the second direction Dy. The first color, the second color, and the third color are not limited to red, green, and blue, respectively, and may be any desired colors, such as complementary colors. In the following description, the first sub-pixel 49R, the second sub-pixel 49G, and the third sub-pixel 49B are referred to as sub-pixels 49 when they need not be distinguished from one another.

The sub-pixels 49 each include the inorganic light-emitting element 100. The display device 1 displays an image by outputting different light from the respective inorganic light-emitting elements 100 in the first sub-pixel 49R, the second sub-pixel 49G, and the third sub-pixel 49B. The inorganic light-emitting element 100 is an inorganic light-emitting diode (LED) chip having a size of approximately 3 μm to 300 μm in planar view and is called a micro LED. A display device including the micro LEDs in the respective sub-pixels is also called a micro LED display device. The term "micro" of the micro LED is not intended to limit the size of the inorganic light-emitting element 100.

Figure 3:
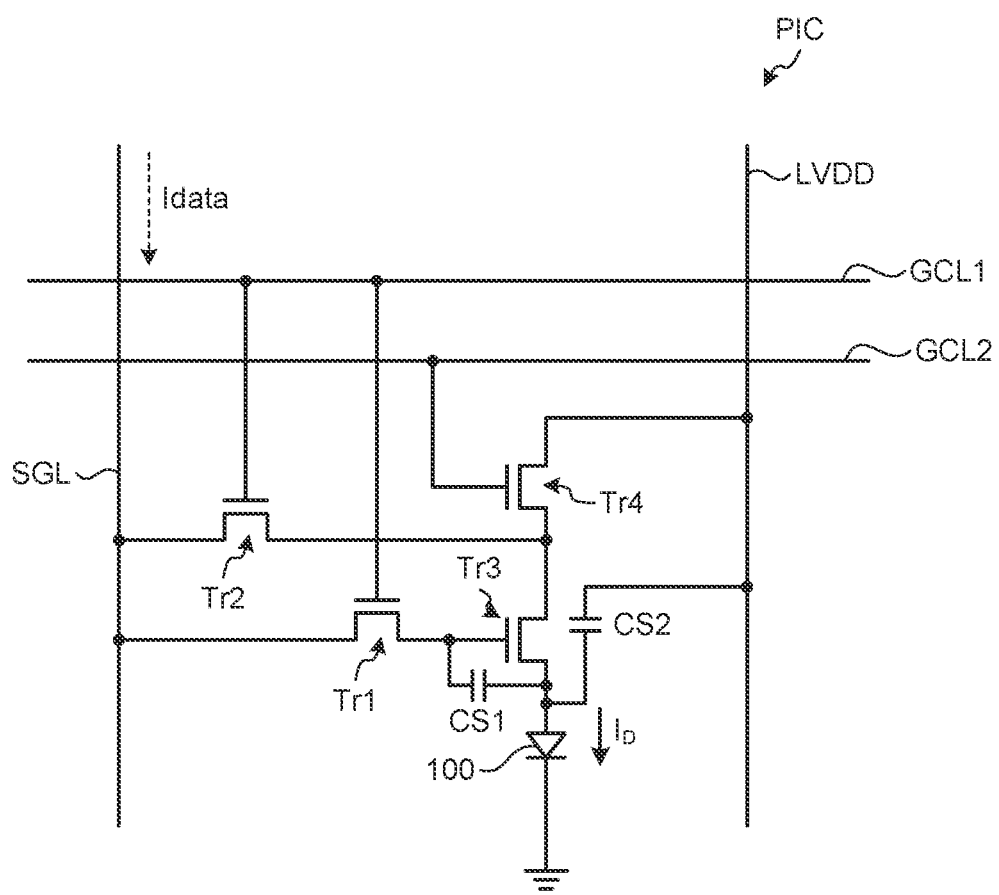
FIG. 3 is a circuit diagram of an exemplary configuration of a pixel circuit of the display device according to the embodiment.

FIG. 3 is a circuit diagram of an exemplary configuration of a pixel circuit of the display device according to the embodiment. A pixel circuit PIC is a drive circuit that drives the inorganic light-emitting element 100. As illustrated in FIG. 3, the pixel circuit PIC includes a switching transistor Tr1, current switching transistors Tr2 and Tr4, a drive transistor Tr3, and the inorganic light-emitting element 100.

The transistors Tr1 to Tr4 and a transistor Tr5 (refer to FIG. 4), which will be described later, are thin-film transistors (TFTs).

The gate of the transistor Tr1 is coupled to the first gate line GCL1, the source thereof is coupled to a signal line SGL, and the drain thereof is coupled to the gate of the transistor Tr3. The gate of the transistor Tr2 is coupled to the first gate line GCL1, the source thereof is coupled to the signal line SGL, and the drain thereof is coupled to the source of the transistor Tr3 and the drain of the transistor Tr4. The gate of the transistor Tr3 is coupled to the drain of the transistor Tr1, the source thereof is coupled to the drains of the respective transistors Tr2 and Tr4, and the drain thereof is coupled to the anode of the inorganic light-emitting element 100. The gate of the transistor Tr4 is coupled to the second gate line GCL2, the source thereof is coupled to a power-supply line LVDD, and the drain thereof is coupled to the drain of the transistor Tr2 and the source of the transistor Tr3.

A first end of first capacitance CS1 is coupled to the drain of the transistor Tr1 and the gate of the transistor Tr3, and a second end thereof is coupled to the drain of the transistor Tr3 and the anode of the inorganic light-emitting element 100. A first end of second capacitance CS2 is coupled to the power-supply line LVDD, and a second end thereof is coupled to the anode of the inorganic light-emitting element 100. The first capacitance CS1 and the second capacitance CS2 are added to the pixel circuit PIC to prevent deviations in a gate voltage due to parasitic capacitance and current leakage of the transistor Tr1. The cathode of the inorganic light-emitting element 100 is coupled to a reference potential. The reference potential is a ground potential, for example.

The power-supply line LVDD is coupled to a constant voltage source. The power-supply line LVDD supplies a DC contact voltage Vdd to the source of the transistor Tr4 and the first end of the second capacitance CS2. The signal line SGL is coupled to a constant current source. The signal line SGL supplies a DC constant current Idata to the sources of the respective transistors Tr1 and Tr2. The first gate line GCL1 and the second gate line GCL2 are coupled to the drive circuit (refer to FIG. 1.). The first gate line GCL1 supplies a voltage Vgcl1 as a selection signal to the gate of the transistor Tr2. The second gate line GCL2 supplies a voltage Vgcl2 as a selection signal to the gate of the transistor Tr4.

When the display device 1 switches the electric potential of the first gate line GCL1 to High and switches the electric potential of the second gate line GCL2 to Low, the transistors Tr1 and Tr2 are turned ON, and the transistor Tr4 is turned OFF. As a result, the constant current Idata is supplied from the signal line SGL to the inorganic light-emitting element 100. When the display device 1 switches the electric potential of the first gate line GCL1 to Low and switches the electric potential of the second gate line GCL2 to High, the transistors Tr1 and Tr2 are turned OFF, and the transistor Tr4 is turned ON. As a result, the constant voltage Vdd is supplied from the power-supply line LVDD to the inorganic light-emitting element 100.

Figure 4:
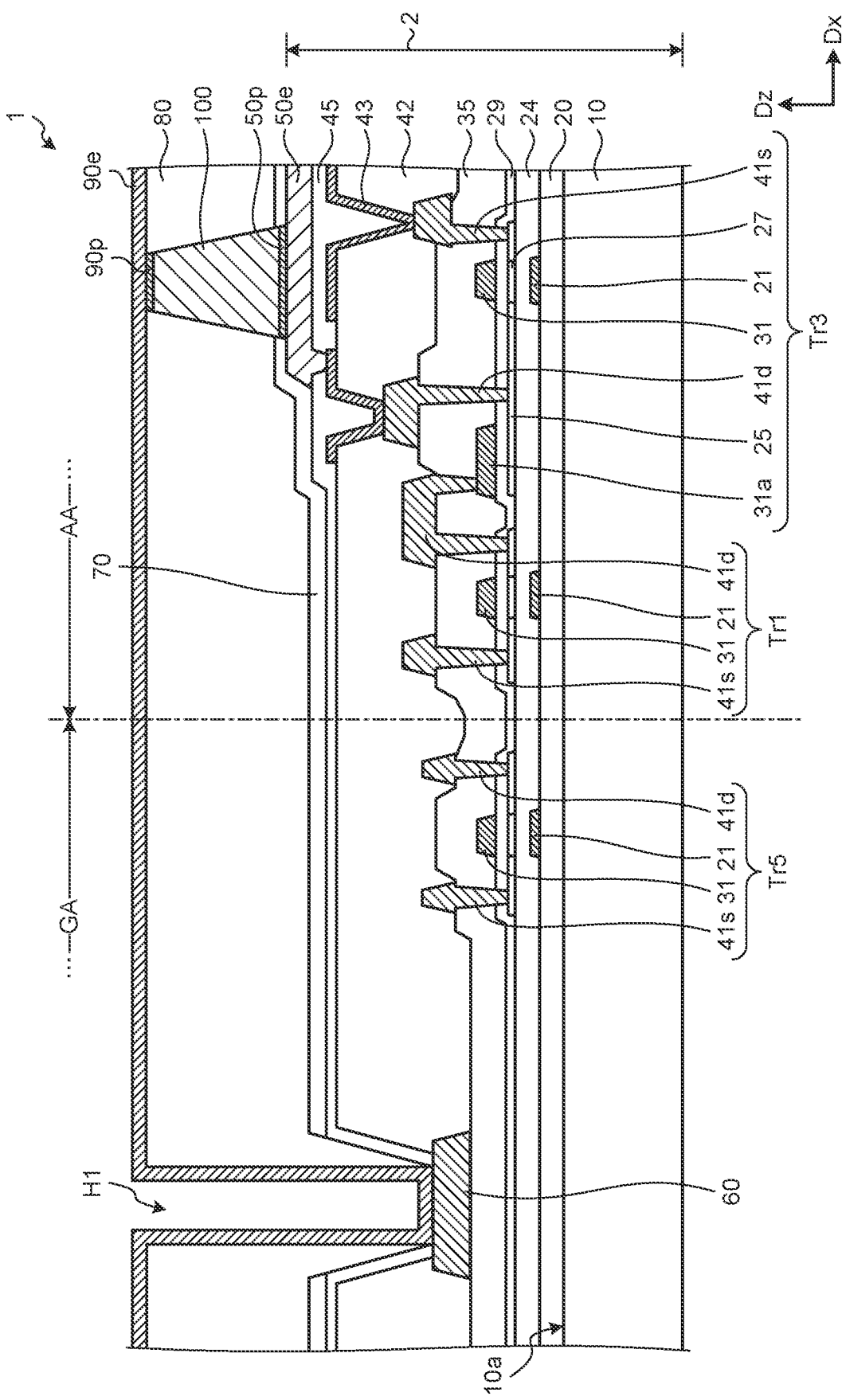
FIG. 4 is a sectional view of an exemplary configuration of the display device.
Figure 5:
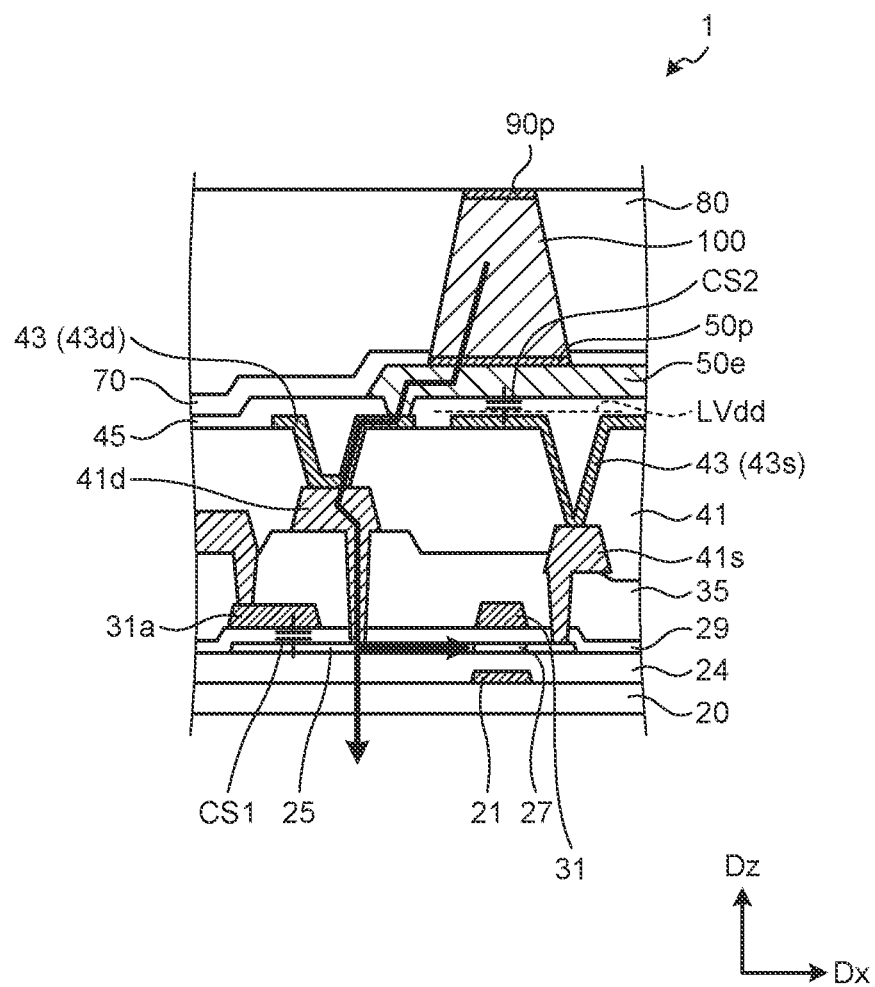
FIG. 5 is an enlarged sectional view of an inorganic light-emitting element and a transistor coupled to the inorganic light-emitting element in the display device.

FIG. 4 is a sectional view of an exemplary configuration of the display device. FIG. 4 illustrates a section along line IV-IV' of the plan view in FIG. 1. FIG. 5 is an enlarged sectional view of the inorganic light-emitting element and the transistor coupled to the inorganic light-emitting element in the display device. As illustrated in FIGS. 4 and 5, the display device 1 includes the substrate 10, an undercoat layer 20, and a plurality of transistors. The undercoat layer 20 is provided on the first surface 10a of the substrate 10. The transistors are provided on the undercoat layer 20. In the display region AA of the substrate 10, for example, the transistors Tr1, Tr2, Tr3, and Tr4 included in the sub-pixel 49 are provided as a plurality of transistors. In the peripheral region GA of the substrate 10, the transistors Tr5 included in the drive circuits 12 are provided as a plurality of transistors.

The substrate 10 is a glass substrate, a quartz substrate, or a flexible substrate made of acrylic resin, epoxy resin, polyimide resin, or polyethylene terephthalate (PET) resin, for example. The transistors Tr1 to Tr5 are TFTs having a double-sided gate structure, for example. The transistors Tr1 to Tr5 each include a first gate electrode 21, an insulating film 24, a semiconductor layer 25, an insulating film 29, and a second gate electrode 31. The first gate electrode 21 is provided on the undercoat layer 20. The insulating film 24 is provided on the undercoat layer 20 to cover the first gate electrode 21. The semiconductor layer 25 is provided on the insulating film 24. The insulating film 29 is provided on the semiconductor layer 25. The second gate electrode 31 is provided on the insulating film 29. The insulating films 24 and 29 are inorganic insulating films made of $SiO_2$ or SiN, for example. The first gate electrode 21 and the second gate electrode 31 face each other in the third direction Dz with the insulating film 24, the semiconductor layer 25, and the insulating film 29 interposed therebetween. The part of the insulating films 24 and 29 sandwiched between the first gate electrode 21 and the second gate electrode 31 functions as a gate insulating film. The part of the semiconductor layer 25 sandwiched between the first gate electrode 21 and the second gate electrode 31 functions as a channel 27 of the TFT. The part of the semiconductor layer 25 coupled to a source electrode 41s, which will be described later, corresponds to the source of the TFT, and the part coupled to a drain electrode 41d, which will be described later, corresponds to the drain of the TFT.

The structure of the transistors Tr1 to Tr5 according to the present embodiment is not limited to the double-sided gate structure. The transistors Tr1 to Tr5 may have a bottom-gate structure in which the gate electrode is composed of only the first gate electrode 21. Alternatively, the transistors Tr1 to Tr5 may have a top-gate structure in which the gate electrode is composed of only the second gate electrode 31. The undercoat layer 20 is not necessarily provided.

The display device 1 also includes an insulating film 35, the source electrode 41s, the drain electrode 41d, the cathode wiring 60, and an insulating film 42. The insulating film 35 is provided on the first surface of the substrate 10 to cover the transistors Tr1 to Tr5. The source electrode 41s passes through the insulating film 35 and is coupled to the sources of the respective transistors Tr1 to Tr5. The drain electrode 41d passes through the insulating film 35 and is coupled to the drains of the respective transistors Tr1 to Tr5. The cathode wiring 60 is provided on the insulating film 35. The insulating film 42 covers the source electrode 41s, the drain electrode 41d, and the cathode wiring 60. The insulating film 35 is an inorganic insulating film, and the insulating film 42 is an organic insulating film.

The display device 1 also includes a source coupling wiring 43s, a drain coupling wiring 43d, and an insulating film 45. The source coupling wiring 43s passes through the insulating film 42 and is coupled to the source electrode 41s. The drain coupling wiring 43d passes through the insulating film 41 and is coupled to the drain electrode 41d. The insulating film 45 is provided on the insulating film 42 to cover the source coupling wiring 43s and the drain coupling wiring 43d. The display device 1 also includes an anode electrode 50e (first electrode) provided on the insulating film 45. The anode electrode 50e passes through the insulating film 45 and is coupled to the drain coupling wiring 43d of the transistor Tr3. The anode electrode 50e (first electrode) is coupled to an anode terminal 50p (first terminal) of the inorganic light-emitting element 100.

The display device 1 also includes an insulating film 70, a planarization film 80, and the cathode electrode 90e. The insulating film 70 is provided on the insulating film 45 to cover the side surfaces of the anode electrode 50e. The planarization film 80 is provided on the insulating film 70 to cover the side surfaces of the inorganic light-emitting element 100. The cathode electrode 90e is provided on the planarization film 80. The insulating film 70 is an inorganic insulating film made of a silicon nitride film (SiN), for example. The planarization film 80 is an organic insulating film or an inorganic-organic hybrid insulating film (made of material in which an organic group (a methyl group or a phenyl group) is bonded to a main chain of Si—O, for example). The upper surface (cathode terminal 90p) of the inorganic light-emitting element 100, for example, is exposed from the planarization film 80. The cathode electrode 90e is coupled to the upper surface (cathode terminal 90p) exposed from the planarization film 80 in the inorganic light-emitting element 100. In the peripheral region GA, the planarization film 80 and the insulating films 70, 45, and 42 have an opening H1 the bottom surface of which corresponds to the cathode wiring 60. The cathode electrode 90e is coupled to the cathode wiring 60 from the upper surface of the planarization film 80 through the inner surface of the opening H1.

In the display device 1, the array substrate 2 includes the layers from the substrate 10 to the anode electrode 50e. The array substrate 2 does not include the insulating film 70, the planarization film 80, the cathode electrode 90e, or the inorganic light-emitting element 100.

The transistors Tr1 to Tr5 included in the array substrate 2 according to the present embodiment have positive temperature characteristics (temperature coefficient). Consequently, the transistors Tr1 to Tr5 have smaller ON resistance and a higher drive current as the temperature rises.

If the substrate 10 is a quartz substrate, the transistor having a positive temperature coefficient is a TFT made of high-temperature polysilicon or microcrystalline oxide semiconductor, for example. Examples of the oxide semiconductor include, but are not limited to, IGZO, zinc oxide (ZnO), ITZO, etc. IGZO is indium gallium zinc oxide, and ITZO is indium tin zinc oxide.

If the substrate 10 is a silicon (Si) substrate, the transistor having a positive temperature coefficient is a TFT made of high-temperature polysilicon, low-temperature polysilicon (LTPS), or microcrystalline oxide semiconductor, for example. As described above, examples of the oxide semiconductor include, but are not limited to, IGZO, ZnO, ITZO, etc.

If the substrate 10 is a glass substrate, the transistor having a positive temperature coefficient is a TFT made of amorphous silicon, microcrystalline oxide semiconductor, amorphous oxide semiconductor, LTPS, or gallium nitride (GaN), for example. As described above, examples of the oxide semiconductor include, but are not limited to, IGZO, ZnO, ITZO, etc.

If the substrate 10 is a flexible substrate, the transistor having a positive temperature coefficient is a TFT made of amorphous silicon, microcrystalline oxide semiconductor, amorphous oxide semiconductor, or LTPS, for example. As described above, examples of the oxide semiconductor include, but are not limited to, IGZO, ZnO, ITZO, etc. The flexible substrate is a substrate made of polyimide, for example.

The material (hereinafter, referred to as substrate material) of the substrate 10 according to the present embodiment has lower thermal conductivity than electrode material, which will be described later. Examples of the substrate material include, but are not limited to, glass, quartz, polyimide, polyethylene terephthalate (PET), etc. The thermal conductivity of glass is 1.5 ($W \cdot m^{-1} \cdot K^{-1}$). The thermal conductivity of quarts is 1.7 ($W \cdot m^{-1} \cdot K^{-1}$). The thermal conductivity of polyimide is 0.18 ($W \cdot m^{-1} \cdot K^{-1}$). The thermal conductivity of PET is 0.22 ($W \cdot m^{-1} \cdot K^{-1}$). As a result, the substrate 10 has a higher heat storage effect, thereby contributing to an increase in the drive current in the transistors Tr1 to Tr5.

Examples of the material (hereinafter, referred to as electrode material) of the first gate electrode 21, the second gate electrode 31, the source electrode 41s, the drain electrode 41d, the source coupling wiring 43s, the drain coupling wiring 43d, the anode electrode 50e, the anode terminal 50p, the cathode wiring 60, the cathode electrode 90e, and the cathode terminal 90p include, but are not limited to, titanium (Ti), molybdenum (Mo), tungsten (W), tantalum (Ta), niobium (Nb), indium tin oxide (ITO), aluminum (Al), silver (Ag), Ag alloy, copper (Cu), carbon nanotube, graphite, graphene, carbon nanobud, etc.

The thermal conductivity of Ti is 22 ($W \cdot m^{-1} \cdot K^{-1}$). The thermal conductivity of Mo is 138 ($W \cdot m^{-1} \cdot K^{-1}$). The thermal conductivity of W is 173 ($W \cdot m^{-1} \cdot K^{-1}$). The thermal conductivity of Ta is 58 ($W \cdot m^{-1} \cdot K^{-1}$). The thermal conductivity of Nb is 54 ($W \cdot m^{-1} \cdot K^{-1}$). The thermal conductivity of ITO is 5 ($W \cdot m^{-1} \cdot K^{-1}$). The thermal conductivity of Al is 236 ($W \cdot m^{-1} \cdot K^{-1}$). The thermal conductivity of Ag is 400 ($W \cdot m^{-1} \cdot K^{-1}$). The thermal conductivity of Cu is 400 ($W \cdot m^{-1} \cdot K^{-1}$). The thermal conductivity of carbon nanotube is 3000 ($W \cdot m^{-1} \cdot K^{-1}$). The thermal conductivity of graphite is 1500 ($W \cdot m^{-1} \cdot K^{-1}$). The thermal conductivity of graphene is 4000 ($W \cdot m^{-1} \cdot K^{-1}$). The thermal conductivity of carbon nanobud is 1700 ($W \cdot m^{-1} \cdot K^{-1}$). The material having a thermal conductivity exceeding 400 ($W \cdot m^{-1} \cdot K^{-1}$) is referred to as high thermal conductive material according to the present embodiment.

The following more specifically describes the electrode material. The anode electrode 50e and the cathode electrode 90e are directly coupled to the inorganic light-emitting element 100 serving as a heat source. The anode electrode 50e is made of conductive material having higher thermal conductivity than the substrate material and insulating material. The anode electrode 50e preferably includes at least one or more layers made of conductive material having a thermal conductivity of 20 ($W \cdot m^{-1} \cdot K^{-1}$) or higher. As a result, the anode electrode 50e can efficiently transmit heat generated by the inorganic light-emitting element 100 to a position away from the inorganic light-emitting element 100. Examples of the material of the anode electrode 50e include, but are not limited to, Al or Al alloy material, Cu or Cu alloy material, carbon-based material (graphene, graphite, carbon nanotube, or carbon nanobud), etc.

The anode electrode 50e may have a multilayered structure. In this case, the thickness of the material having higher thermal conductivity is preferably thicker than that of the material having lower thermal conductivity. Examples of the multilayered structure of the anode electrode 50e include, but are not limited to, Al/Mo, AL alloy material/Mo, Mo/Al/ Mo, Mo/Al alloy material/Mo, Al/Ti, Al alloy material/Ti, Ti/Al/Ti, Ti/Al alloy material/Ti, conductive metal oxide/Al, conductive metal oxide/Al alloy, Cu/Ti, Cu alloy material/ Ti, Cu alloy material/Ta, conductive metal oxide/Cu, conductive metal oxide/Cu alloy, etc.

The cathode electrode 90e is made of conductive material having higher thermal conductivity than the insulating material. The cathode electrode 90e needs to have optical transparency to cover the upper surface of the inorganic light-emitting element 100. The conductive material having optical transparency and higher thermal conductivity than the insulating material is ITO, for example.

The source electrode 41s and the drain electrode 41d include at least one or more layers made of conductive material having a thermal conductivity of 20 ($W \cdot m^{-1} \cdot K^{-1}$) or higher. As a result, the source electrode 41s and the drain electrode 41d can efficiently transmit heat generated by the inorganic light-emitting element 100 to the transistors Tr1 to Tr5. Examples of the material of the source electrode 41s and the drain electrode 41d include, but are not limited to, Al or Al alloy material, Cu or Cu alloy material, the carbon-based material described above, etc.

The source electrode 41s and the drain electrode 41d may have a multilayered structure. In this case, the thickness of the material having higher thermal conductivity is preferably thicker than that of the material having lower thermal conductivity. The multilayered structure of the source electrode 41s and the drain electrode 41d is the same as that in the example of the anode electrode 50e.

At least part of the multilayered structure constituting the source electrode 41s may be the source coupling wiring 43s, and at least part of the multilayered structure constituting the drain electrode 41d may be the drain coupling wiring 43d. In this case, the source coupling wiring 43s and the drain coupling wiring 43d may be ITO thinner than the source electrode 41s and the drain electrode 41d.

The material (hereinafter, referred to as insulating material) of the insulating films 24, 29, 35, 42, and 45 included in the array substrate 2 has lower thermal conductivity than the electrode material. Examples of the insulating material include, but are not limited to, a silicon oxide film ($SiO_2$), a silicon nitride film (SiN), a silicon oxynitride film (SiON), acrylic resin, epoxy resin, etc. The thermal conductivity of $SiO_2$ is 1.3 ($W \cdot m^{-1} \cdot K^{-1}$). The thermal conductivity of SiN is 1.4 ($W \cdot m^{-1} \cdot K^{-1}$). The thermal conductivity of SiON is 1.35 ($W \cdot m^{-1} \cdot K^{-1}$). The thermal conductivity of acrylic resin is 0.23 ($W \cdot m^{-1} \cdot K^{-1}$). The thermal conductivity of epoxy resin is 0.21 ($W \cdot m^{-1} \cdot K^{-1}$). As a result, the insulating films 24, 29, 35, 42, and 45 have a higher heat storage effect, thereby effectively storing heat transmitted from the inorganic light-emitting element 100 around the transistors Tr1 to Tr5. The insulating films 24, 29, 35, 42, and 45 can contribute to an increase in the drive current in the transistors Tr1 to Tr5 having positive temperature characteristics.

The inorganic light-emitting element 100 and the drive transistor Tr3 according to the present embodiment are coupled with the electrode material having higher thermal conductively than the insulating material. With this configuration, as indicated by the arrow in FIG. 5, the display device 1 can transmit heat generated by the inorganic light-emitting element 100 to the semiconductor layer 25 of the transistor Tr3 via the anode electrode 50e, the drain coupling wiring 43d, and the drain electrode 41d.

In the coupling wiring (the drain coupling wiring 43d and the drain electrode 41d) that couples the anode electrode 50e and the transistor Tr3, the thermal conductivity preferably gradually increases from the anode electrode 50e to the transistor Tr3. If the drain coupling wiring 43d is made of ITO, for example, the drain electrode 41d is preferably made of material having higher thermal conductivity than ITO. With this configuration, heat is efficiently transmitted from the anode electrode 50e to the transistor Tr3.

The first gate electrode 21 and the second gate electrode 31 are preferably made of material having lower thermal conductivity than the high thermal conductive material. The material of the first gate electrode 21 and the second gate electrode 31 is preferably high-melting material, such as Mo or Mo alloy, W or W alloy, and Ta or Ta alloy. The material of the first gate electrode 21 and the second gate electrode 31 preferably has lower thermal conductivity than the material of the source electrode 41s and the drain electrode 41d. As a result, the first gate electrode 21 and the second gate electrode 31 have a higher heat storage effect than the source electrode 41s and the drain electrode 41d, thereby enabling heat to be stored in the channel 27.

Figure 6:
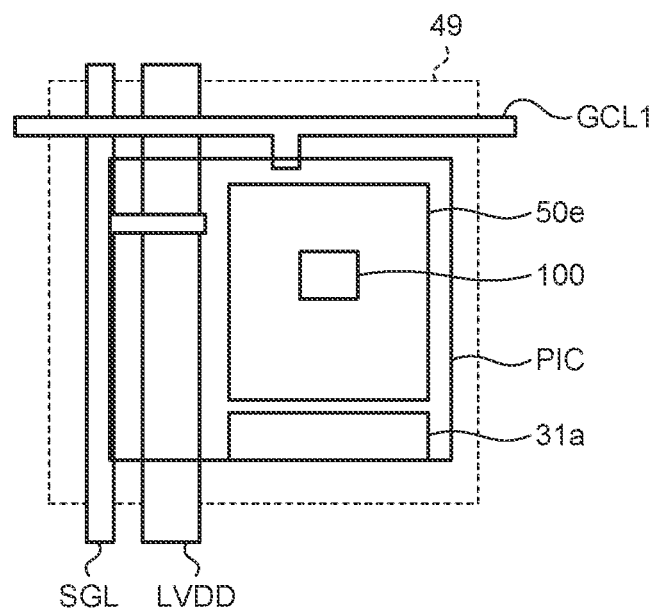
FIG. 6 is a plan view of the inorganic light-emitting element, an anode electrode, and coupling wiring.

FIG. 6 is a plan view of the pixel circuit including the inorganic light-emitting element, the anode electrode, and the coupling wiring. As illustrated in FIG. 6, the anode electrode 50e positioned under the inorganic light-emitting element 100 protrudes from the inside to the outside of the inorganic light-emitting element 100 in the sub-pixel 49. In the sub-pixel 49, the area of the anode electrode 50e in planar view is larger than that of the inorganic light-emitting element 100 in planar view. This structure increases the heat capacity of the anode electrode 50e. The heat generated by the inorganic light-emitting element 100 is efficiently transmitted to the anode electrode 50e having a larger heat capacity from the inorganic light-emitting element 100.

In the sub-pixel 49, the pixel circuit PIC positioned under the anode electrode 50e protrudes from the inside to the outside of the anode electrode 50e. The pixel circuit PIC includes the source coupling wiring 43s and the drain coupling wiring 43d (hereinafter, they are collectively referred to as coupling wiring 43). In the sub-pixel 49, the arrangement area of the pixel circuit PIC including the coupling wiring 43 in planar view is larger than the area of the anode electrode 50e in planar view. With this structure, the width of the coupling wiring 43 can be made larger than that of the pixel electrode in at least one of the X-direction and the Y-direction, thereby increasing the heat capacity of the coupling wiring 43. The heat generated by the inorganic light-emitting element 100 is efficiently transmitted to the coupling wiring 43 having a larger heat capacity from the anode electrode 50e.

Figure 7:
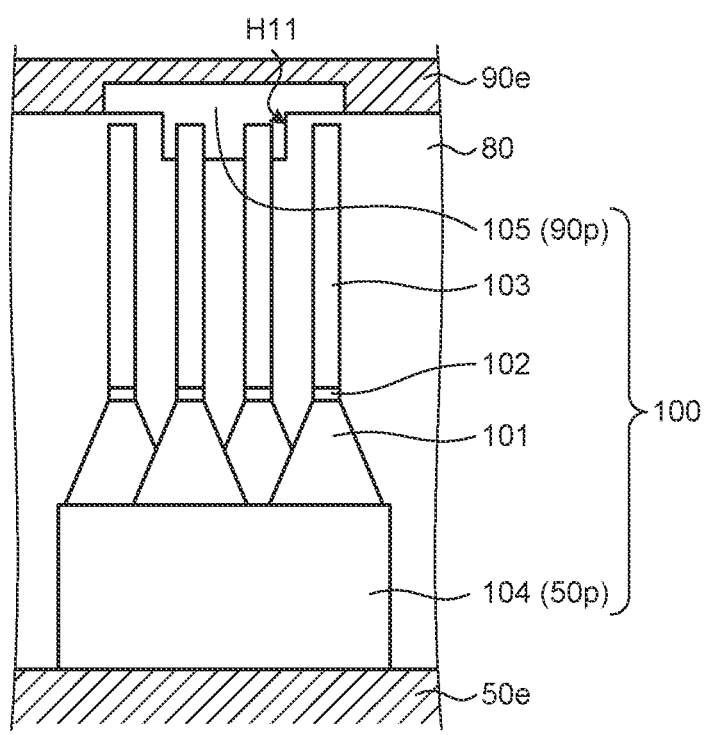
FIG. 7 is a sectional view of an exemplary configuration of the inorganic light-emitting element.

FIG. 7 is a sectional view of an exemplary configuration of the inorganic light-emitting element. As illustrated in FIG. 7, the inorganic light-emitting element 100 includes a p-type cladding layer 101, an active layer 102, an n-type cladding layer 103, a p-type electrode layer 104, and an n-type electrode layer 105. The active layer 102 is provided on the p-type cladding layer 101. The n-type cladding layer 103 is provided on the active layer 102. The p-type electrode layer 104 includes the anode terminal 50p, is positioned between the anode electrode 50e and the p-type cladding layer 101, and is in contact with the anode electrode 50e and the p-type cladding layer 101. The p-type cladding layer 101, the active layer 102, the n-type cladding layer 103, and the n-type electrode layer 105 are layered in this order on the p-type electrode layer 104.

The n-type cladding layer 103, the active layer 102, and the p-type cladding layer 101 are light-emitting layers and are made of a compound semiconductor, such as gallium nitride (GaN) and aluminum indium phosphorus (AlInP). The n-type electrode layer 105 is made of translucent conductive material, such as ITO. The n-type electrode layer 105 corresponds to the cathode terminal 90p of the inorganic light-emitting element 100 and is coupled to the cathode electrode 90e. The p-type electrode layer 104 corresponds to the anode terminal 50p of the inorganic light-emitting element 100 and includes a Pt layer and a thick Au layer produced by plating. The thick Au layer is coupled to a placement surface 50a of the anode electrode 50e.

The side surfaces of the inorganic light-emitting element 100 are covered with the planarization film 80. The planarization film 80 is a spin-on-glass (SOG) film, for example. A recess H11 is formed at the upper part of the planarization film 80. The upper part of the n-type cladding layer 103 protrudes from the recess H11. The n-type electrode layer 105 includes the cathode terminal 90p, has the recess H11, and is in contact with the n-type cladding layer 103 and the cathode electrode 90e. With this configuration, an electric current can flow between the anode electrode 50e and the cathode electrode 90e with the inorganic light-emitting element 100 interposed therebetween.

Figure 8:
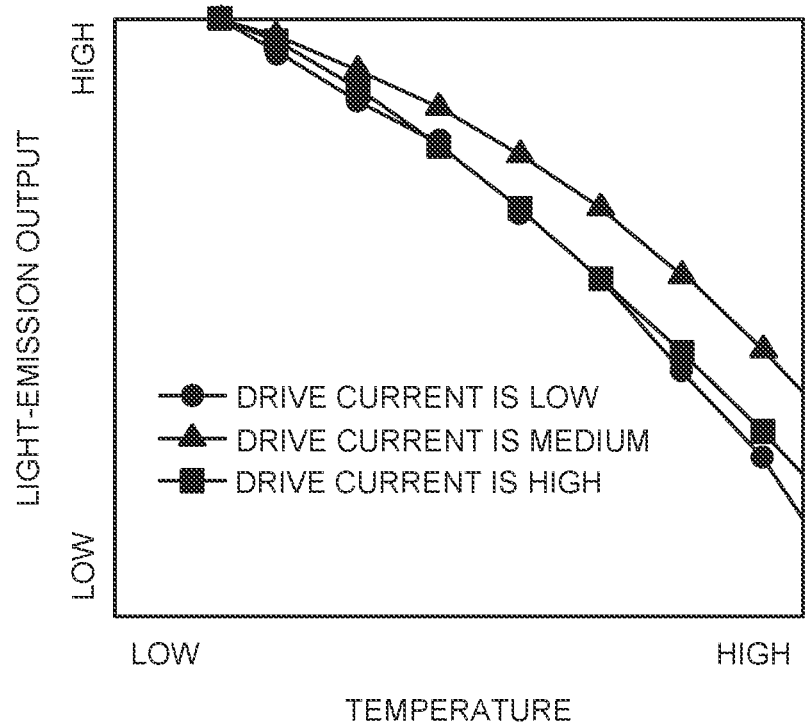
FIG. 8 is a graph of temperature characteristics of the inorganic light-emitting element.

FIG. 8 is a graph of the temperature characteristics of the inorganic light-emitting element. The abscissa in FIG. 8 indicates the temperature of the inorganic light-emitting element, and the ordinate indicates the light-emission output of the inorganic light-emitting element. As illustrated in FIG. 8, the inorganic light-emitting element has the tendency that the light-emission output decreases, and the light-emitting operation becomes unstable as the temperature rises. Any type of inorganic light-emitting elements having low to high drive currents have this tendency.

Figure 9:
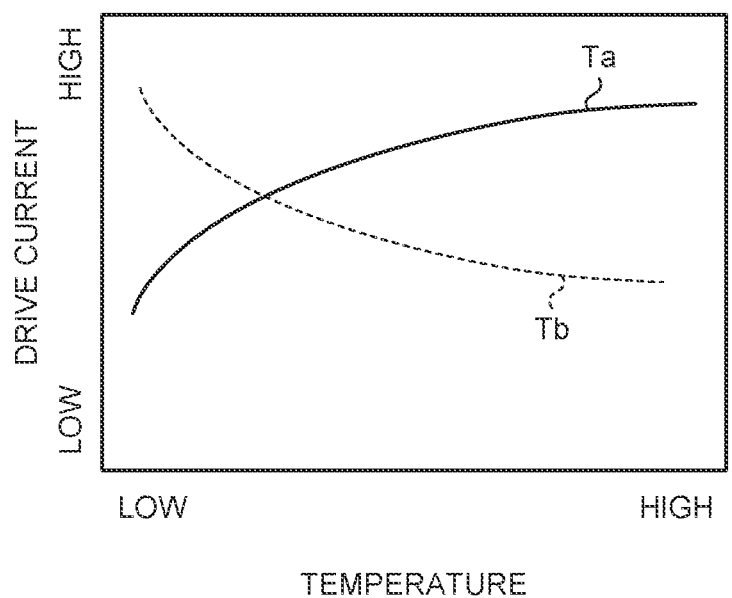
FIG. 9 is a graph of the relation between a drive current of the transistor and temperature.

FIG. 9 is a graph of the relation between the drive current of the transistor and the temperature. The abscissa in FIG. 9 indicates the temperature, and the ordinate indicates the drive current of the transistor. In FIG. 9, Ta indicates the characteristics of the transistor having a positive temperature coefficient, and Tb indicates the characteristics of the transistor having a negative temperature coefficient. As illustrated in FIG. 9, the transistor having positive temperature characteristics has a higher drive current as the temperature rises. The transistor having negative temperature characteristics has a lower drive current as the temperature rises.

As described above, the temperature characteristics of the transistors Tr1 to Tr5 included in the array substrate 2 are positive. The temperature characteristics of the inorganic light-emitting element 100 are negative. The temperature characteristics of the inorganic light-emitting element 100 are opposite to those of the transistors Tr1 to Tr5. Heat generated by the inorganic light-emitting element 100 is transmitted to the transistors Tr1 to Tr5 and the substrate 10 via the anode electrode 50e, the source coupling wiring 43s, the drain coupling wiring 43d, the source electrode 41s, and the drain electrode 41d. This mechanism can prevent rise in temperature of the inorganic light-emitting element 100 and reduction in light-emission output. In addition, this mechanism can promote rise in temperature of the transistors Tr1 to Tr5, thereby increasing the drive current.

As described above, the display device 1 according to the present embodiment includes the substrate 10, the sub-pixels 49, the inorganic light-emitting elements 100, the anode electrode 50e, the transistors Tr1 to Tr5, and the coupling wiring. The sub-pixels 49 are arrayed on the substrate 10 and display different colors. The inorganic light-emitting elements 100 are provided to the respective sub-pixels 49. The anode electrode 50e is electrically coupled to the anode of the inorganic light-emitting element 100. The transistors Tr1 to Tr5 are provided on the first surface 10a of the substrate 10. The coupling wiring (e.g., the drain coupling wiring 43d and the drain electrode 41d) couples the anode electrode 50e and the transistors Tr1 to Tr5. The anode electrode 50e protrudes from the inside to the outside of the inorganic light-emitting element 100 in planar view from the normal direction (e.g., the third direction Dz) of the substrate 10.

With this configuration, the display device 1 can release heat generated by the inorganic light-emitting element 100 to the substrate 10 via the anode electrode 50e, the drain coupling wiring 43d, and the drain electrode 41d. As a result, the display device 1 can prevent a rise in temperature of the inorganic light-emitting element 100 and reduction in light output (reduction in luminance) of the inorganic light-emitting element 100 due to temperature rise. Consequently, the display device 1 can prevent deterioration of display characteristics.

Part of the heat generated by the inorganic light-emitting element 100 is transmitted to the transistors Tr1 to Tr5 arranged on the substrate 10 via the anode electrode 50e. As illustrated in FIG. 4, for example, part of the heat generated by the inorganic light-emitting element 100 is transmitted to the channel 27 of the transistor Tr3 via the anode electrode 50e, the drain coupling wiring 43d, and the drain electrode 41d. Consequently, the display device 1 can increase the drive current in the transistors Tr1 to Tr5 having positive temperature characteristics.

The area of the anode electrode 50e is larger than that of the inorganic light-emitting element 100 in planar view. With this structure, heat is efficiently transmitted from the inorganic light-emitting element 100 to the anode electrode 50e because the anode electrode 50e has a larger heat capacity.

The transistors Tr1 to Tr5 are positioned closer to the substrate 10 than the inorganic light-emitting element 100 is. With this configuration, the transistors Tr1 to Tr5 are positioned on a heat transmission path from the inorganic light-emitting element 100 to the substrate 10. Consequently, heat is efficiently transmitted from the inorganic light-emitting element 100 to the transistors Tr1 to Tr5.

The temperature characteristics of the transistors Tr1 to Tr5 are positive. Consequently, the transistors Tr1 to Tr5 have a higher drive current with a rise in temperature.

The coupling wiring that couples the anode electrode 50e and the transistor Tr3 includes a first portion and a second portion. The first portion (e.g., the drain coupling wiring 43d) is coupled to the anode electrode 50e, and the second portion (e.g., the drain electrode 41d) is coupled to the transistor Tr3. The drain electrode 41d has higher thermal conductivity than the drain coupling wiring 43d. With this structure, heat is efficiently transmitted from the drain coupling wiring 43d to the drain electrode 41d.

The display device 1 also includes a gate line 31a and a first dielectric film. The gate line 31a is coupled to the second gate electrode 31 of the transistor Tr3. The first dielectric film (e.g., the insulating film 29) is positioned between the semiconductor layer 25 of the transistor Tr3 and the gate line 31a. With this configuration, the first capacitance CS1 is formed between the semiconductor layer 25 of the transistor Tr3 and the gate line 31a.

The display device 1 also includes the power-supply line LVDD and a second dielectric film. The power-supply line LVDD is positioned between the inorganic light-emitting element 100 and the substrate 10. The second dielectric film (e.g., the insulating film 45) is positioned between the anode electrode 50e and the power-supply line LVDD. With this configuration, the second capacitance CS2 is formed between the anode electrode 50e and the power-supply line LVDD.

The array substrate 2 according to the present embodiment is provided with a plurality of inorganic light-emitting elements 100 that display different colors. The array substrate 2 includes the substrate 10, the anode electrode 50e, the transistors Tr1 to Tr5, and the coupling wiring. The anode electrode 50e is provided on the first surface 10a of the substrate 10 and electrically coupled to the anode of the inorganic light-emitting element 100. The transistors Tr1 to Tr5 are provided on the first surface 10a of the substrate 10. The coupling wiring (e.g., the drain coupling wiring 43d and the drain electrode 41d) couples the anode electrode 50e and the transistors Tr1 to Tr5. The area of the anode electrode 50e is larger than that of the inorganic light-emitting element 100 in planar view from the third direction Dz. With this configuration, heat is efficiently transmitted from the inorganic light-emitting element 100 to the anode electrode 50e because the anode electrode 50e has a larger heat capacity.

MODIFICATIONS

Figure 10:
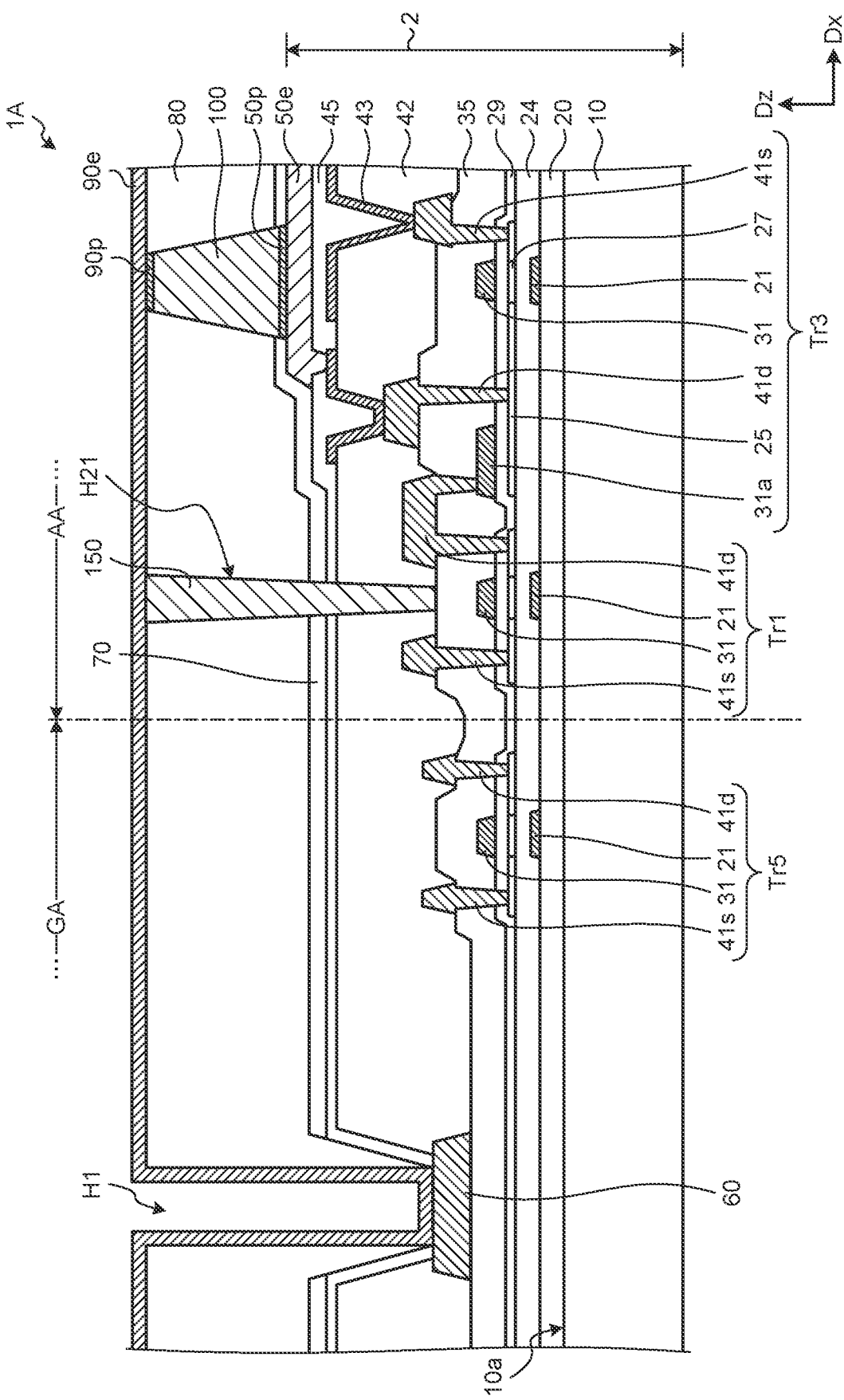
FIG. 10 is a sectional view of the display device according to a first modification of the embodiment.

FIG. 10 is a sectional view of the display device according to a first modification of the embodiment. As illustrated in FIG. 10, a display device 1A according to the first modification of the embodiment includes a heat transmitter 150 that functions as a heat transmission path from the cathode electrode 90e to the substrate 10. The display device 1A, for example, has a through hole H21 continuously extending through the insulating films 42, 45, and 70 and the planarization film 80. The bottom surface of the through hole H21 corresponds to the insulating film 35. The heat transmitter 150 is disposed in the through hole H21. The upper end of the heat transmitter 150 is in contact with the cathode electrode 90e. The lower end of the heat transmitter 150 is in contact with the insulating film 35. With this configuration, the display device 1A can transmit part of the heat generated by the inorganic light-emitting element 100 to the substrate 10 via the cathode electrode 90e and the heat transmitter 150. The heat transmitter 150 is in contact with the insulating film 35 constituting the transistors Tr, thereby transmitting heat to the transistors Tr and increasing the drive current in the transistors Tr.

The thermal conductivity of the heat transmitter 150 is higher than that of the planarization film 80. The heat transmitter 150 is made of carbon-based material (graphene, graphite, carbon nanotube, or carbon nanobud) having a thermal conductivity of higher than 1000 (W·m$^{-1}$·K$^{-1}$), for example. The material of the heat transmitter 150 is not limited to the carbon-based material. The heat transmitter 150 may be made of the same conductive material as that of the cathode electrode 90e, for example. The heat transmitter 150 is in contact with only the insulating material except the cathode electrode 90e. With this configuration, the heat transmitter 150 does not function as a current path even if it is made of conductive material.

Figure 11:
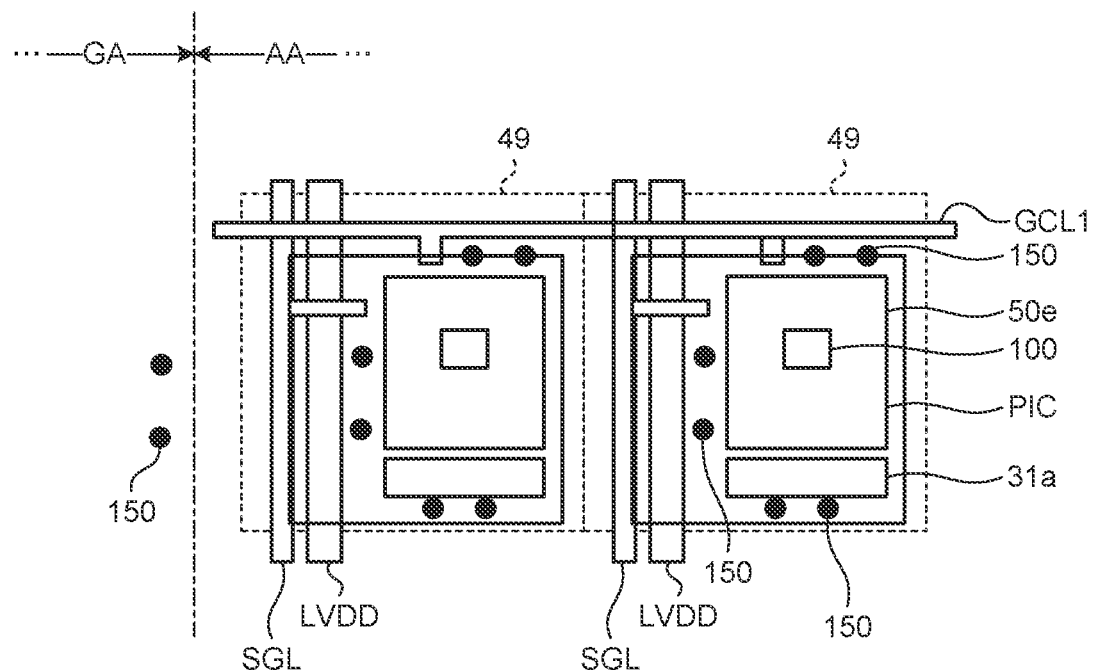
FIG. 11 is a plan view of an example of the positions of heat transmitters.

FIG. 11 is a plan view of an example of the positions of the heat transmitters. The heat transmitters 150 may be disposed in the display region AA or the peripheral region GA. As indicated by the dotted line in FIG. 11, the heat transmitters 150 may be disposed around any one of the transistors Tr1 to Tr5. This configuration can increase the drive current in the transistors Tr. By providing the heat transmitters 150 especially around the transistor Tr (transistor Tr3) directly coupled to the inorganic light-emitting element 100, an electric current supplied to the inorganic light-emitting element 100 can be increased. The heat transmitter 150 is an example of a first heat transmitter according to the present disclosure.

Figure 12:
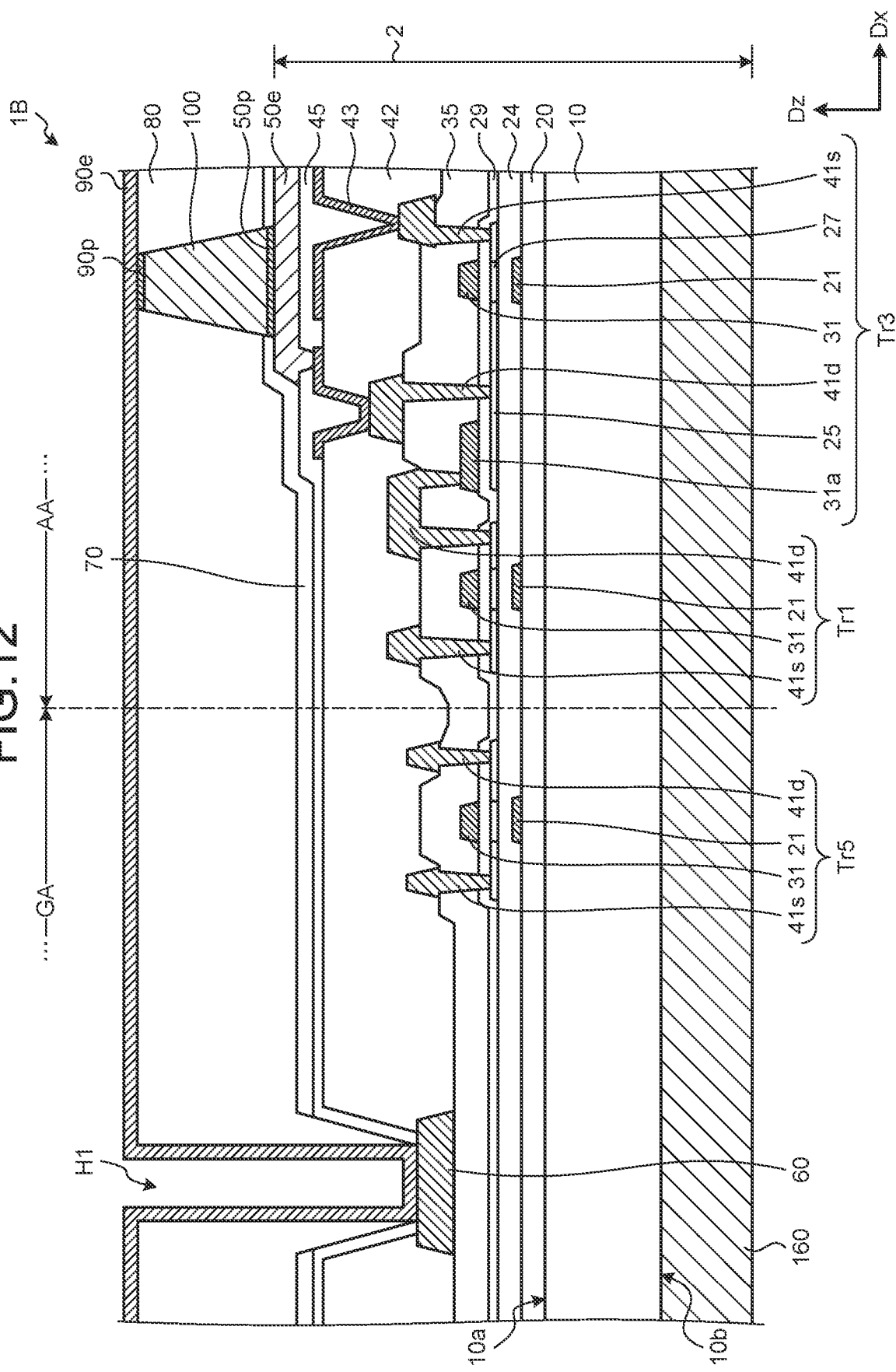
FIG. 12 is a sectional view of the display device according to a second modification of the embodiment.

FIG. 12 is a sectional view of the display device according to a second modification of the embodiment. As illustrated in FIG. 12, a display device 1B according to the second modification of the embodiment includes a heat radiator 160. The heat radiator 160 is provided on a second surface 10b positioned opposite to the first surface 10a of the substrate 10. The heat radiator 160 is made of material having higher thermal conductivity than the substrate 10. The heat radiator 160 is preferably made of material, such as Ti and Al, having a thermal conductivity of 20 ($W \cdot m^{-1} \cdot K^{-1}$) or higher. With this configuration, heat of the substrate 10 can be efficiently transmitted to the heat radiator 160 and prevented from remaining in the substrate 10. If the heat remains in the substrate 10, heat transmission from the inorganic light-emitting element 100 to the substrate 10 is stagnated. As a result, the temperature of the inorganic light-emitting element 100 may possibly rise, thereby deteriorating the light-emission output. The heat radiator 160 reduces this possibility. The heat radiator 160 may be covered with an insulating film.

While the heat radiator 160 is provided to the whole second surface 10b of the substrate 10 in FIG. 12, this is given by way of example only. The heat radiator 160 may be provided not to the whole second surface 10b of the substrate 10 but to part of the second surface 10b. The heat radiator 160 may be disposed in a region facing the display region AA, for example.

Figure 13:
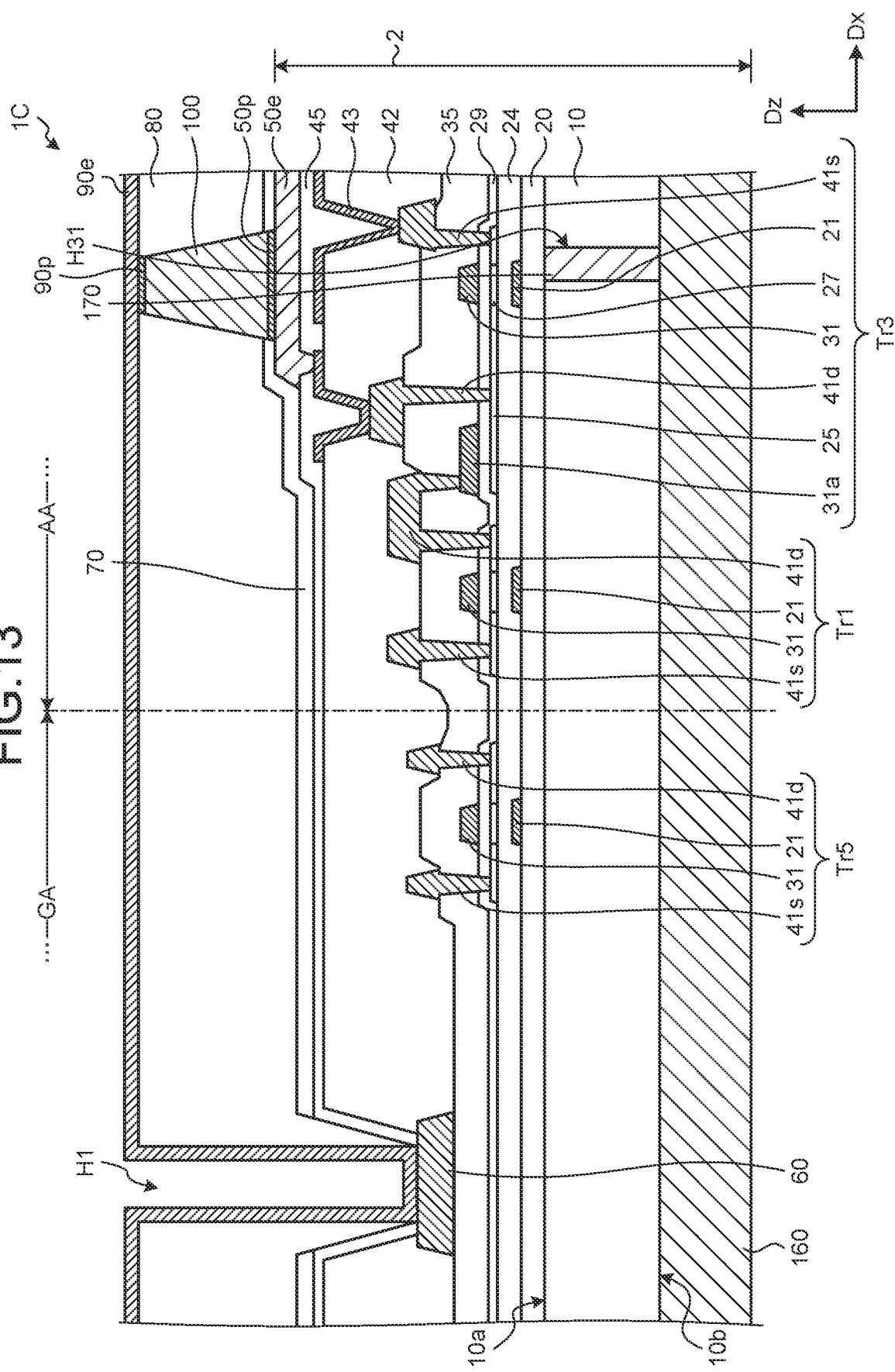
FIG. 13 is a sectional view of the display device according to a third modification of the embodiment.

FIG. 13 is a sectional view of the display device according to a third modification of the embodiment. As illustrated in FIG. 13, a display device 1C according to the third modification of the embodiment includes a heat transmitter 170 that couples the undercoat layer 20 and the heat radiator 160. The display device 1C, for example, has a through hole H31 extending through the first surface 10a and the second surface 10b of the substrate 10. The heat transmitter 170 is disposed in the through hole H31. The upper end of the heat transmitter 170 is in contact with the undercoat layer 20. The lower end of the heat transmitter 170 is in contact with the heat radiator 160. The heat transmitter 170 is made of material having higher thermal conductivity than the substrate 10. The heat transmitter 170 is preferably made of material, such as Ti and Al, having a thermal conductivity of 20 ($W \cdot m^{-1} \cdot K^{-1}$) or higher. With this configuration, heat of the substrate 10 can be efficiently transmitted to the heat radiator 160 via the heat transmitter 170. The heat transmitter 170 is an example of a second heat transmitter according to the present disclosure. The heat radiator 160 may be covered with an insulating film.

The embodiment above describes the inorganic light-emitting element 100 as a type having the lower part (anode terminal 50p) coupled to the anode electrode 50e and the upper part (cathode terminal 90p) coupled to the cathode electrode 90e (hereinafter, referred to as a face-up type). The type of the inorganic light-emitting element according to the present embodiment is not limited to the face-up type. The inorganic light-emitting element according to the present embodiment may be a face-down type having the lower part coupled to both the anode electrode and the cathode electrode.

Figure 14:
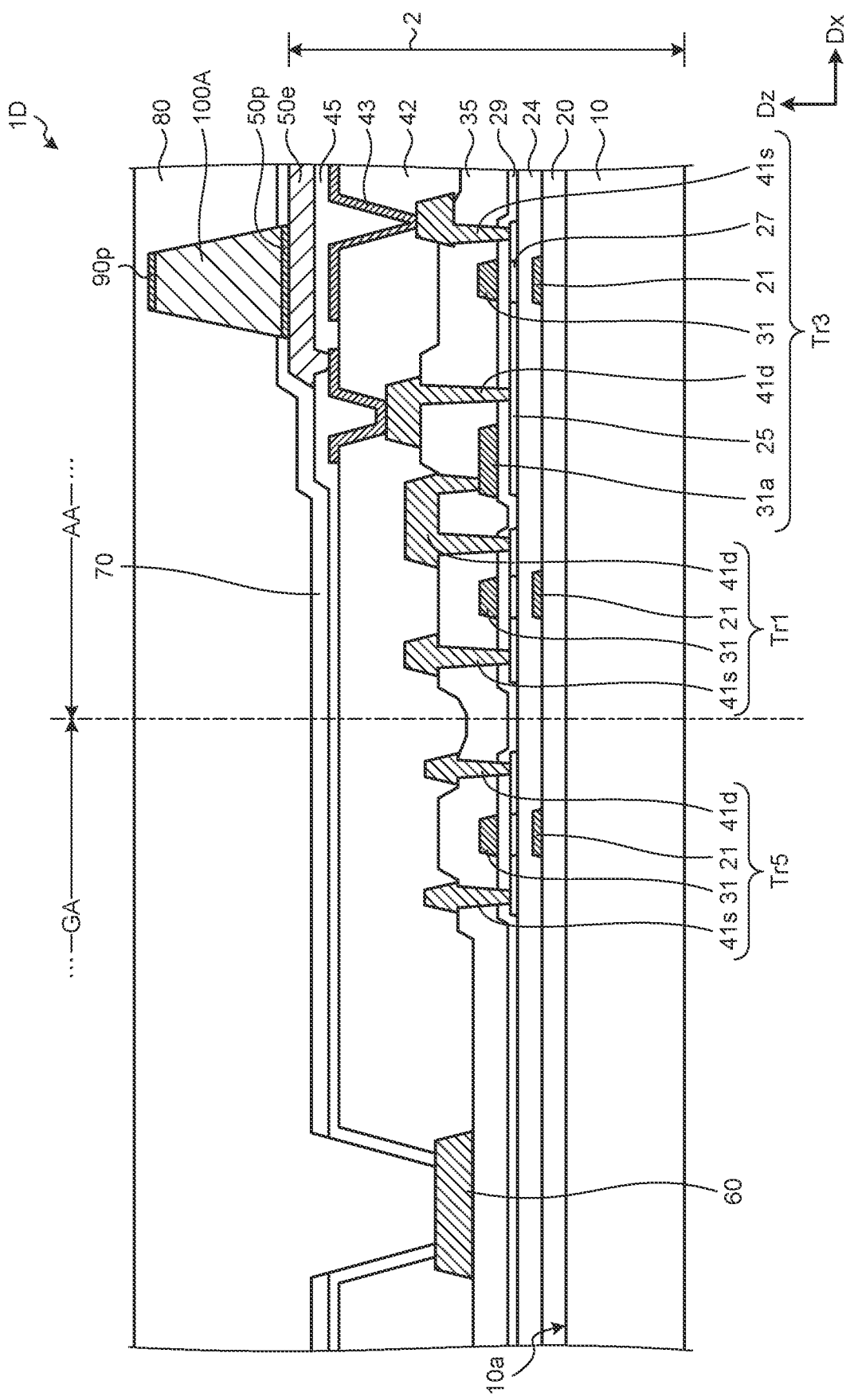
FIG. 14 is a sectional view of the display device according to a fourth modification of the embodiment.

FIG. 14 is a sectional view of the display device according to a fourth modification of the embodiment. As illustrated in FIG. 14, a display device 1D according to the fourth modification of the embodiment includes a face-down type inorganic light-emitting element 100A. The lower part of the inorganic light-emitting element 100A is coupled to both the anode electrode 50e and a cathode electrode 90eA. The cathode electrode 90eA is provided at a position away from the anode electrode 50e on the insulating film 45. The cathode electrode 90eA, for example, is made of the same material as that of the anode electrode 50e. The cathode electrode 90eA is produced simultaneously with the anode electrode 50e in the same process.

Figure 15:
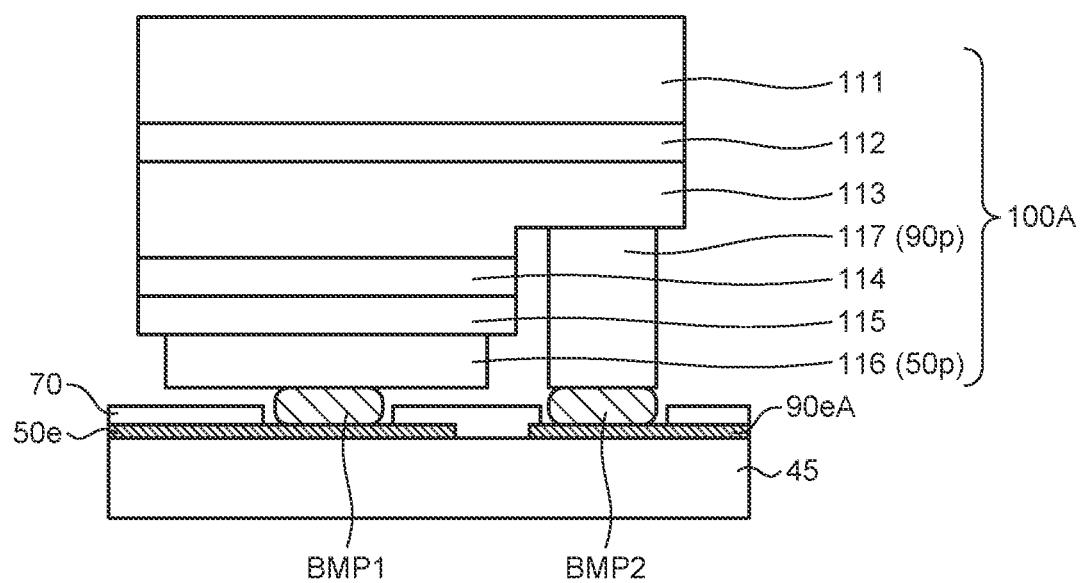
FIG. 15 is a sectional view of the inorganic light-emitting element according to the fourth modification of the embodiment.

FIG. 15 is a sectional view of the inorganic light-emitting element according to the fourth modification of the embodiment. As illustrated in FIG. 15, the face-down type inorganic light-emitting element 100A includes a substrate 111, a buffer layer 112, an n-type cladding layer 113, an active layer 114, a p-type cladding layer 115, a p-type electrode layer 116, an n-type electrode layer 117, and bump electrodes BMP1 and BMP2. The buffer layer 112, the n-type cladding layer 113, the active layer 114, the p-type cladding layer 115, and the p-type electrode layer 116 are layered in this order from a first surface of the substrate 111. The n-type cladding layer 113 has a region exposed from the active layer 114. This region is provided with the n-type electrode layer 117. As illustrated in FIG. 15, the p-type electrode layer 116 includes the anode terminal 50p and is coupled to the anode electrode 50e with the bump electrode BMP1 interposed therebetween. The n-type electrode layer 117 includes the cathode terminal 90p and is coupled to the cathode electrode 90eA with the bump electrode BMP2 interposed therebetween.

The substrate 111 is made of sapphire, for example. The n-type cladding layer 113 is made of n-type GaN. The active layer 114 is made of InGaN. The p-type cladding layer 115 is made of p-type GaN. The p-type electrode layer 116 is made of palladium (Pd) and gold (Au) and has a multilayered structure in which Au is layered on Pd. The n-type electrode layer 117 is made of indium (In).

In the inorganic light-emitting element 100A, the p-type cladding layer 115 and the n-type cladding layer 113 are not directly bonded, and another layer (active layer 114) is provided therebetween. With this configuration, carriers, such as electrons and holes, can be concentrated in the active layer 114, thereby efficiently recombining the carriers (emitting light). The active layer 114 may have a multi-quantum well structure (MQW structure) in which well layers and barrier layers composed of several atomic layers are cyclically layered for higher efficiency.

Also in this configuration, the display device 1D can release heat generated by the face-down type inorganic light-emitting element 100A to the substrate 10 via the anode electrode 50e and the cathode electrode 90eA. As a result, the display device 1D can prevent a rise in temperature of the inorganic light-emitting element 100A and reduction in light output (reduction in luminance) of the inorganic light-emitting element 100A due to temperature rise. Consequently, the display device 1D can prevent deterioration of display characteristics.

Part of the heat generated by the inorganic light-emitting element 100A is transmitted to the transistors Tr1 to Tr5 (refer to FIG. 4) arranged on the substrate 10 via the anode electrode 50e. Part of the heat generated by the inorganic light-emitting element 100A, for example, is transmitted to the channel 27 of the transistor Tr3 via the anode electrode 50e, the drain coupling wiring 43d, and the drain electrode 41d. Consequently, the display device 1D can increase the drive current in the transistors Tr1 to Tr5 having positive temperature characteristics.

Figure 16:
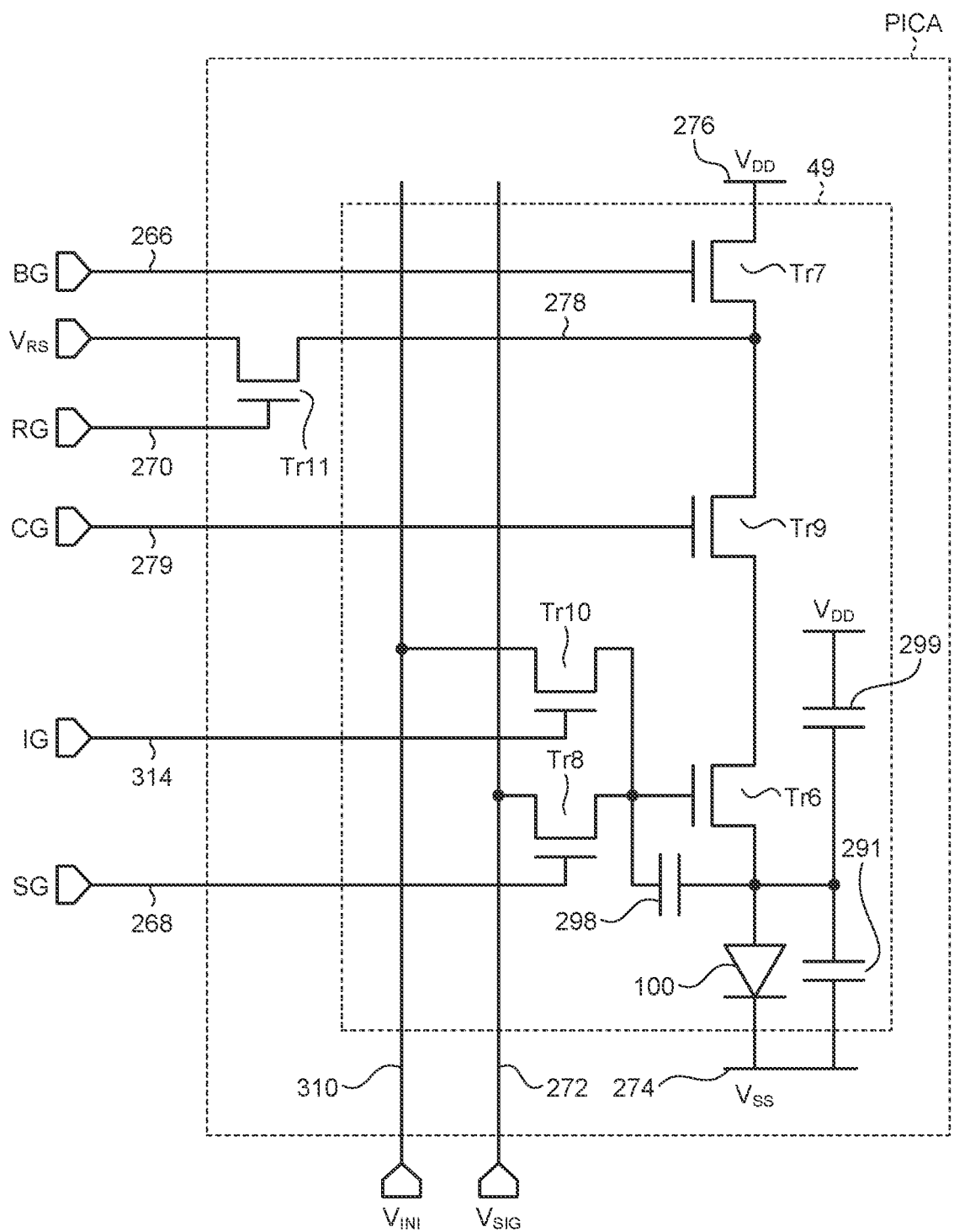
FIG. 16 is a circuit diagram of the pixel circuit according to a fifth modification of the embodiment.

The configuration of the pixel circuit according to the present embodiment is not limited to that illustrated in FIG. 3. FIG. 16 is a circuit diagram of the pixel circuit according to a fifth modification of the embodiment. As illustrated in FIG. 16, a pixel circuit PICA according to the fifth modification of the embodiment includes a drive transistor Tr6, a lighting switch Tr7, a writing switch Tr8, a light-emission control switch Tr9, an initialization switch Tr10, and a reset switch Tr11.

The cathode (cathode terminal 90p) of the inorganic light-emitting element 100 is coupled to a power-supply line 274. The anode (anode terminal 50p) of the inorganic light-emitting element 100 is coupled to a power-supply line 276 via the drive transistor Tr6 and the lighting switch Tr7.

The power-supply line 276 is supplied with a predetermined high voltage as drive potential $V_{DD}$ from a drive power source. The power-supply line 274 is supplied with a predetermined low voltage as reference potential $V_{SS}$ from a power-supply circuit.

The inorganic light-emitting element 100 is supplied with a forward current (drive current) and emits light by the potential difference ($V_{DD}$-$V_{SS}$) between the drive potential VDD and the reference potential $V_{SS}$. In other words, the drive potential VDD has a potential difference for causing the inorganic light-emitting element 100 to emit light with respect to the reference potential $V_{SS}$. Capacitance 291 serving as an equivalent circuit is provided between the anode terminal 50p and the cathode terminal 90p and coupled in parallel with the inorganic light-emitting element 100. Additional capacitance 299 is provided between the anode terminal 50p of the inorganic light-emitting element 100 and the power-supply line 276 that supplies the drive potential $V_{DD}$. The capacitance 291 may be coupled to a reference potential other than the anode terminal 50p and the cathode terminal 90p.

The drive transistor Tr6, the lighting switch Tr7, and the light-emission control switch Tr9 according to the present embodiment are n-type TFTs. The source electrode of the drive transistor Tr6 is coupled to the anode terminal 50p of the inorganic light-emitting element 100, and the drain electrode thereof is coupled to the source electrode of the light-emission control switch Tr9. The gate electrode of the light-emission control switch Tr9 is coupled to a light-emission control line 279. The drain electrode of the light-emission control switch Tr9 is coupled to the source electrode of the lighting switch Tr7. The gate electrode of the lighting switch Tr7 is coupled to a lighting control line 266. The drain electrode of the lighting switch Tr7 is coupled to the power-supply line 276. The gate electrode of the reset switch Tr11 is coupled to a reset control line 270. The gate electrode of the writing switch Tr8 is coupled to a writing control line 268. The gate electrode of the initialization switch Tr10 is coupled to an initialization control line 314.

The drain electrode of the drive transistor Tr6 is also coupled to a reset power source via the reset switch Tr11. In the present modification, reset lines 278 and the reset switches Tr11 are provided to respective pixel rows. The reset lines 278 each extend along the corresponding pixel row. The reset line 278 is coupled in common to the drain electrodes of the drive transistors Tr6 of the corresponding pixel row via the light-emission control switches Tr9 of the corresponding pixel row. In other words, the sub-pixels 49 constituting the pixel row share the reset line 278 and the reset switch Tr11. The reset switch Tr11 is disposed at an end of the pixel row, for example, and switches coupling and decoupling between the reset line 278 and the reset power source, that is, determines whether to couple or decouple between them. The reset switch Tr11 according to the present modification is an n-type TFT like the drive transistor Tr6, the lighting switch Tr7, and the light-emission control switch Tr9.

The gate electrode serving as a control terminal of the drive transistor Tr6 is coupled to a video signal line 272 via the writing switch Tr8 and coupled to an initialization signal line 310 via the initialization switch Tr10. Holding capacitance 298 is coupled between the gate electrode and the source electrode of the drive transistor Tr6. The writing switch Tr8 and the initialization switch Tr10 according to the present embodiment are n-type TFTs like the drive transistor Tr6, the lighting switch Tr7, and the reset switch Tr11.

While the present embodiment describes a circuit example in which the drive transistor Tr6, the lighting switch Tr7, the reset switch Tr11, the writing switch Tr8, the light-emission control switch Tr9, and the initialization switch Tr10 are n-type TFTs, the present embodiment is not limited thereto. The drive transistor Tr6, the lighting switch Tr7, the reset switch Tr11, the writing switch Tr8, the light-emission control switch Tr9, and the initialization switch Tr10 may be p-type TFTs. Alternatively, the present embodiment has a circuit configuration combining p-type TFTS and n-type TFTs.

FIG. 16 illustrates various signals, including a writing control signal SG supplied to the writing switch Tr8, a lighting control signal BG supplied to the lighting switch Tr7, a reset control signal RG supplied to the reset switch Tr11, a light-emission control signal CG supplied to the light-emission control switch Tr9, and an initialization control signal IG supplied to the initialization switch Tr10.

The present modification selects a plurality of pixel rows in order from the first row (e.g., the pixel row positioned at the uppermost part of the display region AA in FIG. 1). Subsequently, the present modification writes electric potential Vsig (video writing potential) of video voltage signals VSIG to the sub-pixels 49 of the selected pixel rows and repeats the operation of causing the inorganic light-emitting elements 100 to emit light in units of an image of one frame. The drive circuit applies the electric potential Vsig (video writing potential) of the video voltage signals VSIG to the video signal line 272 and applies electric potential Vini (initialization potential) of initialization voltage signals VINI to the initialization signal line 310 in each horizontal scanning period.

The writing operation according to the present modification can be specifically divided into a reset operation, an offset canceling operation, and a video signal setting operation. The reset operation is an operation for resetting the voltage held in the capacitance 291, the holding capacitance 298, and the additional capacitance 299. The offset canceling operation is an operation for compensating deviations in a threshold voltage Vth of the drive transistor Tr6. The video signal setting operation is an operation for writing the electric potential Vsig (video writing potential) of the video voltage signals VSIG to the sub-pixels 49.

The writing operation (the reset operation, the offset canceling operation, and the video signal setting operation) and the light-emitting operation are sequentially performed pixel row by pixel row. The pixel row is sequentially selected in a cycle of one horizontal scanning period for the video signals, for example. The writing operation and the light-emitting operation performed pixel row by pixel row are repeated in one frame period.

The light-emission enable period of each pixel row is set to a period from the end of the video signal setting operation to the start of the writing operation for the pixel row in the image of the next frame. In the light-emission enable period, the display device 1 has a light-emission period and a non-light-emission period. The light-emission period is a period for causing the inorganic light-emitting elements 100 to emit light with the intensity corresponding to the electric potential Vsig (video writing potential) of the video voltage signals VSIG written to the respective sub-pixels 49. The non-light-emission period is a period for forcibly stopping the drive current supplied to the inorganic light-emitting elements 100. Specifically, in the light-emission period, the display device 1 switches the light-emission control signals CG to the H level to turn on the light-emission control switch Tr9, thereby supplying the forward current (drive current) to the inorganic light-emitting elements 100 from the drive power source. In the non-light-emission period, the display device 1 switches the light-emission control signals CG to the L level to turn off the light-emission control switch Tr9, thereby decoupling the drive power source and the drive transistor Tr6 held in the coupled state. As a result, the display device 1 forcibly stops the forward current (drive current) to be supplied to the inorganic light-emitting elements 100.

While an exemplary embodiment according to the present disclosure has been described, the embodiment is not intended to limit the disclosure. The contents disclosed in the embodiment are given by way of example only, and various changes may be made without departing from the spirit of the present disclosure. Appropriate changes made without departing from the spirit of the present disclosure naturally fall within the scope of the disclosure. At least one of various omissions, substitutions, and changes of the components may be made without departing from the spirit of the embodiment above and the modifications thereof.

What is claimed is:

1. A display device comprising:
   a substrate;
   a plurality of pixels arrayed on the substrate;
   an inorganic light-emitting element provided to each of the pixels;
   an anode electrode electrically coupled to the inorganic light-emitting element;
   a transistor provided on a first surface of the substrate;
   coupling wiring that couples the anode electrode and the transistor;
   an insulating planarization film that covers a side surface of the inorganic light-emitting element; and
   a first heat transmitter disposed in a recess in the insulating planarization film,
   wherein
   the anode electrode protrudes from an inside to an outside of the inorganic light-emitting element in planar view from a normal direction of the substrate,
   temperature characteristics of the transistor are positive,
   temperature characteristics of the inorganic light-emitting element are negative,
   the temperature characteristics of the inorganic light-emitting element are opposite to the temperature characteristics of the transistor,
   an upper end of the first heat transmitter is in contact with a cathode electrode,
   a lower end of the first heat transmitter is in contact with an insulating film constituting the transistor,
   the coupling wiring comprises:
      a first portion coupled to the anode electrode; and
      a second portion coupled to the transistor, and
   the second portion has higher thermal conductivity than the first portion.

2. The display device according to claim 1, further comprising:
   a gate line coupled to a gate of the transistor; and
   a first dielectric film positioned between a semiconductor layer of the transistor and the gate line.

3. The display device according to claim 1, further comprising:
   a power-supply line positioned between the inorganic light-emitting element and the substrate; and
   a second dielectric film positioned between the anode electrode and the power-supply line.

4. The display device according to claim 1, wherein thermal conductivity of the first heat transmitter is higher than thermal conductivity of the insulating planarization film.

5. The display device according to claim 1, wherein the anode electrode is disposed between an anode terminal of the inorganic light-emitting element and the coupling wiring that couples the anode electrode and the transistor, and the anode electrode, the anode terminal, and the coupling wiring all overlap with each other in planar view.

6. The display device according to claim 1, wherein the area of the anode electrode is larger than the area of the inorganic light-emitting element in planar view, such that the anode electrode protrudes from an entire area of the inorganic light-emitting element to the outside of the inorganic light-emitting element in planar view.

7. The display device according to claim 1, wherein the transistor is positioned closer to the substrate than the inorganic light-emitting element is.

8. A display device comprising:
   a substrate;
   a plurality of pixels arrayed on the substrate;
   an inorganic light-emitting element provided to each of the pixels;
   an anode electrode electrically coupled to the inorganic light-emitting element;
   a transistor provided on a first surface of the substrate;
   coupling wiring that couples the anode electrode and the transistor;
   an insulating planarization film that covers a side surface of the inorganic light-emitting element;
   a first heat transmitter disposed in a recess in the insulating planarization film; and
   a heat radiator provided on a second surface opposite to the first surface of the substrate,
   wherein
   the anode electrode protrudes from an inside to an outside of the inorganic light-emitting element in planar view from a normal direction of the substrate,
   temperature characteristics of the transistor are positive,
   temperature characteristics of the inorganic light-emitting element are negative,
   the temperature characteristics of the inorganic light-emitting element are opposite to the temperature characteristics of the transistor,
   an upper end of the first heat transmitter is in contact with a cathode electrode,
   a lower end of the first heat transmitter is in contact with an insulating film constituting the transistor, and
   thermal conductivity of the heat radiator is higher than thermal conductivity of the substrate.

9. The display device according to claim 8, further comprising:
   a second heat transmitter provided in the substrate and coupled to the heat radiator, wherein
   thermal conductivity of the second heat transmitter is higher than thermal conductivity of the substrate.

10. An array substrate provided with a plurality of inorganic light-emitting elements configured to display different colors, the array substrate comprising:
- a substrate;
- an anode electrode provided on a first surface of the substrate and electrically coupled to an anode terminal of the corresponding inorganic light-emitting element;
- a transistor provided on the first surface of the substrate;
- coupling wiring that couples the anode electrode and the transistor;
- an insulating planarization film that covers a side surface of the inorganic light-emitting element; and
- a first heat transmitter disposed in a recess in the insulating planarization film,
- wherein
- the area of the anode electrode is larger than the area of the inorganic light-emitting element in planar view from a normal direction of the substrate,
- temperature characteristics of the transistor are positive,
- temperature characteristics of the inorganic light-emitting element are negative,
- the temperature characteristics of the inorganic light-emitting element are opposite to the temperature characteristics of the transistor,
- an upper end of the first heat transmitter is in contact with a cathode electrode,
- a lower end of the first heat transmitter is in contact with an insulating film constituting the transistor,
- the coupling wiring comprises:
  - a first portion coupled to the anode electrode; and
  - a second portion coupled to the transistor, and
- the second portion has higher thermal conductivity than the first portion.

11. The array substrate according to claim 10, further comprising:
- a gate line coupled to a gate of the transistor; and
- a first dielectric film positioned between a semiconductor layer of the transistor and the gate line.

12. The array substrate according to claim 10, further comprising:
- a power-supply line positioned between the inorganic light-emitting element and the substrate; and
- a second dielectric film positioned between the anode electrode and the power-supply line.

13. The array substrate according to claim 10, wherein thermal conductivity of the first heat transmitter is higher than thermal conductivity of the insulating planarization film.

14. The display device according to claim 10, wherein the anode electrode is disposed between the anode terminal of the inorganic light-emitting element and the coupling wiring that couples the anode electrode and the transistor, and the anode electrode, the anode terminal, and the coupling wiring all overlap with each other in planar view.

15. The array substrate according to claim 10, wherein the area of the anode electrode is larger than the area of the inorganic light-emitting element in planar view, such that the anode electrode protrudes from an entire area of the inorganic light-emitting element to the outside of the inorganic light-emitting element in planar view.

16. The array substrate according to claim 10, wherein the transistor is positioned closer to the substrate than the inorganic light-emitting element is.

17. An array substrate provided with a plurality of inorganic light-emitting elements configured to display different colors, the array substrate comprising:
- a substrate;
- an anode electrode provided on a first surface of the substrate and electrically coupled to an anode terminal of the corresponding inorganic light-emitting element;
- a transistor provided on the first surface of the substrate;
- coupling wiring that couples the anode electrode and the transistor;
- an insulating planarization film that covers a side surface of the inorganic light-emitting element;
- a first heat transmitter disposed in a recess in the insulating planarization film; and
- a heat radiator provided on a second surface opposite to the first surface of the substrate,
- wherein
- the area of the anode electrode is larger than the area of the inorganic light-emitting element in planar view from a normal direction of the substrate,
- temperature characteristics of the transistor are positive,
- temperature characteristics of the inorganic light-emitting element are negative,
- the temperature characteristics of the inorganic light-emitting element are opposite to the temperature characteristics of the transistor,
- an upper end of the first heat transmitter is in contact with a cathode electrode,
- a lower end of the first heat transmitter is in contact with an insulating film constituting the transistor, and
- thermal conductivity of the heat radiator is higher than thermal conductivity of the substrate.

18. The display device according to claim 17, further comprising:
- a second heat transmitter provided in the substrate and coupled to the heat radiator, wherein
- thermal conductivity of the second heat transmitter is higher than thermal conductivity of the substrate.

* * * * *